(12) United States Patent
Motoyama et al.

(10) Patent No.: US 11,139,201 B2
(45) Date of Patent: Oct. 5, 2021

(54) TOP VIA WITH HYBRID METALLIZATION

(71) Applicant: International Business Machines Corporation, Armonk, NY (US)

(72) Inventors: Koichi Motoyama, Clifton Park, NY (US); Nicholas Anthony Lanzillo, Troy, NY (US); Christopher J. Penny, Saratoga Springs, NY (US); Somnath Ghosh, Clifton Park, NY (US); Robert Robison, Rexford, NY (US); Lawrence A. Clevenger, Saratoga Springs, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/672,904

(22) Filed: Nov. 4, 2019

(65) Prior Publication Data
US 2021/0134664 A1    May 6, 2021

(51) Int. Cl.
*H01L 21/768* (2006.01)
*H01L 23/532* (2006.01)
(Continued)

(52) U.S. Cl.
CPC .. *H01L 21/76849* (2013.01); *H01L 21/76846* (2013.01); *H01L 21/76885* (2013.01);
(Continued)

(58) Field of Classification Search
CPC ......... H01L 21/76849; H01L 21/76846; H01L 23/5226; H01L 23/53238; H01L 23/53257; H01L 21/76885; H01L 21/32136
(Continued)

(56) References Cited

U.S. PATENT DOCUMENTS 5,512,514 A    4/1996 Lee
5,691,238 A    11/1997 Avanzino et al.
(Continued)

OTHER PUBLICATIONS

Jiang, et al., "Development of electroless Co via-pretill to enable advanced BEOL metallization and via resistance reduction." In 2016 IEEE International Interconnect Technology Conference/Advanced Metallization Conference (IITC/AMC), pp. 111-113. IEEE, 2016.
(Continued)

*Primary Examiner* — Vu A Vu
(74) *Attorney, Agent, or Firm* — Cantor Colburn LLP; Randall Bluestone

(57) ABSTRACT

Embodiments of the present invention are directed to fabrication methods and resulting structures for subtractively forming a top via using a hybrid metallization scheme. In a non-limiting embodiment of the invention, a surface of a conductive line is recessed below a topmost surface of a first liner layer. The first liner layer can be positioned between the conductive line and a dielectric layer. A top via layer is formed on the recessed surface of the conductive line and a hard mask is formed over a first portion of the top via layer. A second portion of the top via layer is removed. The remaining first portion of the top via layer defines the top via. The conductive line can include copper while the top via layers can include ruthenium or cobalt.

19 Claims, 8 Drawing Sheets

(51) Int. Cl.
*H01L 23/522* (2006.01)
*H01L 21/3213* (2006.01)

(52) U.S. Cl.
CPC .... *H01L 23/5226* (2013.01); *H01L 23/53238* (2013.01); *H01L 23/53257* (2013.01); *H01L 21/32136* (2013.01)

(58) Field of Classification Search
USPC ........................................................ 257/751
See application file for complete search history.

(56) References Cited

U.S. PATENT DOCUMENTS

| | | | |
|---|---|---|---|
| 5,693,568 A | 12/1997 | Liu et al. | |
| 5,773,365 A | 6/1998 | Ito | |
| 5,960,254 A | 9/1999 | Cronin | |
| 6,143,640 A | 11/2000 | Cronin et al. | |
| 6,274,899 B1 * | 8/2001 | Melnick | H01L 27/10855 257/298 |
| 6,352,917 B1 | 3/2002 | Gupta et al. | |
| 6,475,909 B2 * | 11/2002 | Uozumi | C23C 22/63 257/E21.584 |
| 6,495,917 B1 | 12/2002 | Ellis-Monaghan et al. | |
| 6,812,141 B1 * | 11/2004 | Gaidis | H01L 21/76843 438/637 |
| 6,974,770 B2 * | 12/2005 | Costrini | H01L 21/76834 438/637 |
| 7,067,902 B2 | 6/2006 | Hichri et al. | |
| 8,299,625 B2 | 10/2012 | Ponoth et al. | |
| 8,357,609 B2 | 1/2013 | Ryan | |
| 9,401,323 B1 | 7/2016 | Farooq et al. | |
| 9,490,168 B1 | 11/2016 | Chen et al. | |
| 9,548,243 B1 | 1/2017 | Briggs et al. | |
| 9,613,861 B2 | 4/2017 | Anderson et al. | |
| 9,613,862 B2 | 4/2017 | Lenhardt et al. | |
| 9,673,095 B2 | 6/2017 | Farooq et al. | |
| 9,870,899 B2 | 1/2018 | Yang et al. | |
| 9,917,137 B1 | 3/2018 | Briggs et al. | |
| 2008/0237789 A1 | 10/2008 | He et al. | |
| 2010/0052018 A1 | 3/2010 | Cohen et al. | |
| 2010/0264538 A1 | 10/2010 | Swinnen et al. | |
| 2013/0026606 A1 | 1/2013 | Farooq et al. | |
| 2013/0187273 A1 | 7/2013 | Zhang et al. | |
| 2013/0207270 A1 | 8/2013 | Holmes et al. | |
| 2015/0171010 A1 | 6/2015 | Bristol et al. | |
| 2016/0163587 A1 | 1/2016 | Backes et al. | |
| 2018/0130706 A1 | 5/2018 | Chen et al. | |
| 2019/0103310 A1 * | 4/2019 | Liang | H01L 23/5226 |

OTHER PUBLICATIONS

Paolillo, Set al.,"Direct metal etch of ruthenium for advanced interconnect." Journal of Vacuum Science & Technology B, Nanotechnology and Microelectronics: Materials, Processing, Measurement, and Phenomena 36, No. 3 (2018): 03E103.

Wan, et al. "Subtractive etch of ruthenium for sub-5nm interconnect." In 2018 IEEE International Interconnect Technology Conference (IITC), pp. 10-12. IEEE, 2018.

* cited by examiner

TOP VIA WITH HYBRID METALLIZATION

BACKGROUND

The present invention generally relates to fabrication methods and resulting structures for semiconductor devices, and more specifically, to fabrication methods and resulting structures for subtractively forming top vias with a hybrid metallizations.

The fabrication of very large scale integrated (VLSI) or ultra large scale integrated (ULSI) circuits requires the manufacture of sophisticated interconnect structures including metallic wiring that connects individual devices in a semiconductor chip to one another. Typically, the wiring interconnect network consists of two types of features that serve as electrical conductors, namely, line features that traverse a distance across the chip, and conductive via features that connect lines in different levels. The conducting metal lines and conductive vias are made of conductive material, such as aluminum or copper, and are electrically insulated by interlayer dielectrics (ILD). In a multilayered interconnect structure, the metallization layers are referred to as "M" layers (e.g., M1 layer, M2 layer, etc.) while "V" layers denote the conductive vias placed between adjacent M layers (e.g., V1 is between the M1 and M2 layers).

To increase the number of circuits that can be provided on a chip, the semiconductor industry has repeatedly shrunk the transistor gate length and the chip size. As a consequence, the interconnect structure that forms the metallic circuitry has also shrunk. As integrated circuit (IC) feature sizes continue to decrease, the aspect ratio, (i.e., the ratio of height/depth to width) of features such as conductive vias generally increases, complicating the manufacturing process. Fabricating intricate structures of conductive interconnect layers and high aspect ratio vias within increasingly smaller wafer footprints is one of the most process-intensive and cost-sensitive portions of semiconductor IC fabrication.

SUMMARY

Embodiments of the invention are directed to a method for forming top vias using a hybrid metallization scheme. A non-limiting example of the method includes recessing a surface of a conductive line below a topmost surface of a first liner layer. The first liner layer can be positioned between the conductive line and a dielectric layer. A top via layer is formed on the recessed surface of the conductive line and a hard mask is formed over a first portion of the top via layer. A second portion of the top via layer is removed. The remaining first portion of the top via layer defines the top via. The conductive line can include copper while the top via layers can include ruthenium or cobalt.

Embodiments of the invention are directed to a method for forming top vias using a hybrid metallization scheme. A non-limiting example of the method includes forming a trench in a dielectric layer and forming a conductive stack in the trench. The conductive stack can include a barrier liner, a first liner layer, and a conductive line. The first liner layer can be positioned between the barrier liner and the conductive line. A surface of the conductive line is recessed below a topmost surface of the first liner layer and a top via layer is formed on the recessed surface of the conductive line. A hard mask is formed over a first portion of the top via layer. The hard mask is patterned to expose a second portion of the top via layer. The second portion of the top via layer is removed and the remaining first portion of the top via layer defines a top via.

Embodiments of the invention are directed to an integrated circuit. A non-limiting example of the integrated circuit includes a conductive stack. The conductive stack includes a barrier liner, a first liner layer, and a conductive line. The first liner layer is positioned between the barrier liner and the conductive line. A surface of the conductive line is recessed below a topmost surface of the first liner layer. A top via layer is positioned on the recessed surface of the conductive line and a top via is positioned on a surface of the top via layer. The conductive line can include copper, while the top via layers and top via can include ruthenium or cobalt.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
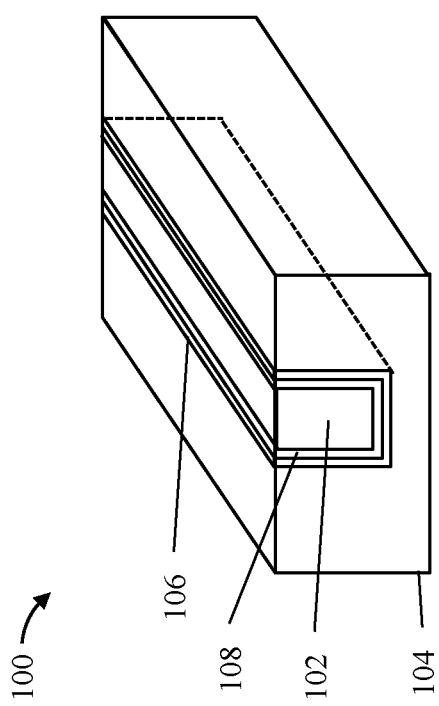
FIG. 1 depicts a cross-sectional view of a semiconductor structure after an initial set of processing operations according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another.

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

The continued scaling of semiconductor devices has resulted in challenging fabrication requirements, especially when fabricating ever smaller metallization layers. Advanced BEOL processes incorporate phase-shifting, optical proximity correction, and other practices to satisfy these scaling demands, and can achieve a line to line pitch below 30 nm. As the BEOL pitch scales below 30 nm, however, R/C delay becomes unsustainably large. R/C delay increases in part because the copper metallization schemes used in the state of the art require a barrier layer between the copper and the surrounding materials to prevent copper diffusion. This barrier layer extends between the via (e.g. the "$V_x$" layer) and the line above (e.g., the "$M_{x+1}$" layer), driving up via resistances, and in turn, R/C delay.

Turning now to an overview of aspects of the present invention, one or more embodiments of the invention address the above-described shortcomings of the prior art by providing a new semiconductor structure and a method for forming top vias with hybrid metallizations. As used herein, a "top via" refers to the "$V_x$" layer via which electrically couples a line below (an "$M_x$" layer) to a line above (an "$M_{x+1}$" layer). This new process leverages a subtractive via integration scheme to form an alternate metal top via (e.g., Co, Ru) directly on copper interconnects (i.e., the line below). In other words, the present process enables the formation of copper interconnects with ruthenium or cobalt top vias formed subtractively above such that the copper line is fully encapsulated by the ruthenium or cobalt. Advantageously, this subtractive via integration scheme allows for an alternate metal "V" layer to be placed directly on the "M" layer without the need for a barrier liner in the "V" layer, dramatically reducing R/C delay and providing an additional 10-15% improvement in frequency performance gauge (FPG) for beyond-beyond-7 nm (BB7) technologies relative to conventional dual damascene schemes below 30 nm pitch.

An interconnect structure in accordance with aspects of the invention can be fabricated by patterning a conductive line (e.g., copper line) in a trench using lithography and an etch. In some embodiments of the invention, a liner made of an alternate metal (e.g., Ru) is formed in the trench prior to depositing the conductive line. In some embodiments of the invention, a barrier liner is formed in the trench prior to depositing the alternate metal liner. A metal layer also made of the alternate metal is deposited over the conductive line. The metal layer and the liner together fully encapsulate the copper material in the alternate metal material. The metal layer is patterned using a hard mask and a dry anisotropic etch (e.g., a chlorine based reactive ion etch) to define the top via. Importantly, the fully encapsulated copper surface is not exposed to the etchant (e.g., chlorine) during this process. Encapsulation is particularly useful when the conductive line is a copper line, as any exposed copper would be damaged during a chlorine-based RIE. The fabrication process can then continue using known BEOL processes. For example, an interlayer dielectric can be deposited over the structure and the structure can be planarized to a surface of the top via.

In some embodiments of the invention, this subtractive scheme is used to form a copper interconnect (an "$M_x$" layer) that is encapsulated by ruthenium on all sides. As a result, copper in the "$M_x$" layer (the line below) cannot diffuse into the surrounding dielectric or into the via above (the "$V_x$" layer). Notably, this subtractive scheme cannot be leveraged using copper alone, as there is no known dry and anisotropic process that can etch copper.

Turning now to a more detailed description of aspects of the present invention, FIG. 1 depicts a cross-sectional view of an interconnect structure 100 after an initial set of fabrication operations according to one or more embodiments of the invention. In FIG. 1, known fabrication operations have been used to form the interconnect structure 100 such that it includes a conductive line 102, a dielectric layer 104, a liner 106, and a liner 108, configured and arranged as shown. While not shown for ease of discussion, the conductive line 102 can be one of many lines in a metallization layer of the interconnect structure 100. Moreover, it is understood that the processes described herein with respect to the conductive line 102 can be used to create hybrid metal interconnects in any of these metallization layers.

In some embodiments of the invention, the conductive line 102 includes a conductive material formed or deposited in a trench of a metallization layer using known back-end-of-line (BEOL) processes. In some embodiments of the invention, the conductive line 102 is overfilled above a surface of the trench (not shown), forming overburdens that can be removed using, for example, a chemical-mechanical planarization (CMP) process. The conductive line 102 can be made of any suitable conducting material, such as, for example, metal (e.g., tungsten, titanium, tantalum, ruthenium, zirconium, cobalt, copper, aluminum, platinum), alloys thereof (such as AlCu, CuMn, CuTi, or the like), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive line 102 is a copper line (copper interconnect). The conductive line 102 can be formed or deposited using, for example, CVD, PECVD, PVD, sputtering, plating, chemical solution deposition, and electroless plating.

In some embodiments of the invention, the dielectric layer 104 is an interlayer dielectric. The dielectric layer 104 serves as an isolation structure for the lines and vias of the interconnect structure 100. The dielectric layer 104 can be made of any suitable dielectric material, such as, for example, low-k dielectrics (materials having a small dielectric constant relative to silicon dioxide, i.e., less than about 3.9), ultra-low-k dielectrics (materials having a dielectric constant less than 3), porous silicates, carbon doped oxides, silicon dioxides, silicon nitrides, silicon oxynitrides, silicon carbide (SiC), or other dielectric materials. Any known manner of forming the dielectric layer 104 can be utilized, such as, for example, CVD, PECVD, ALD, flowable CVD, spin-on dielectrics, or PVD.

In some embodiments of the invention, the liner 106 can be formed between the conductive line 102 and the dielectric layer 104. The liner 106 can serve as a diffusion barrier, preventing the copper (or other metal) from diffusing into, or doping, the surrounding dielectric materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

In some embodiments of the invention, the liner 108 is formed between the conductive line 102 and the liner 106. In some embodiments of the invention, the liner 108 is formed from a different material (e.g., metal) than the conductive line 102. For example, the conductive line 102 can be a copper line and the liner 108 can be formed from an alternate metal. In some embodiments of the invention, the liner 108 can be formed from materials that include a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the liner 108 is made of cobalt or ruthenium. As discussed previously, these alternate metals do not require a metal barrier liner. The liner 108 can be deposited prior to the conductive line 102 (and after forming the liner 106, if present). In some embodiments of the invention, the interconnect structure 100 is planarized to a surface of the liner 106 and/or the liner 108, exposing a surface of the dielectric layer 104.

Figure 2:
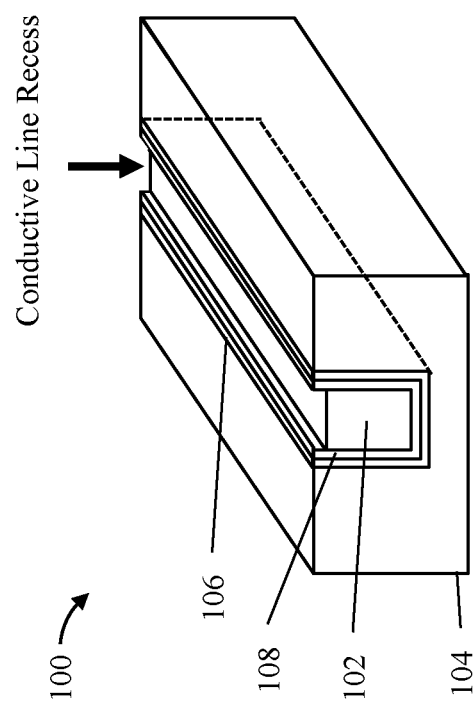
FIG. 2 depicts a cross-sectional view of the semiconductor structure after additional processing operations according to one or more embodiments of the invention.

FIG. 2 depicts a cross-sectional view of the interconnect structure 100 after a processing operation according to one or more embodiments of the invention. In some embodiments of the invention, the conductive line 102 is recessed below a topmost surface of the liner 106 and/or the liner 108. The conductive line 102 can be recessed using known processes. In some embodiments of the invention, the conductive line 102 is recessed selective to the liner 106 and/or the liner 108. For example, copper can be recessed selective to cobalt or ruthenium using copper electroetching. In another example, copper and cobalt can be recessed selective to ruthenium and tantalum nitride using a wet chemical etchant such as alanine. In some embodiments of the invention, the conductive line 102 is recessed 1 to 10 nm, although other recess depths are within the contemplated scope of the invention.

Figure 3:
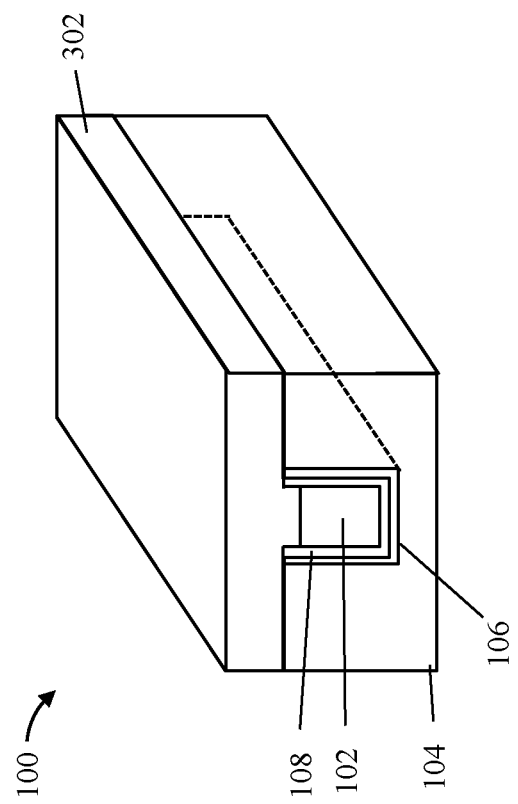
FIG. 3 depicts a cross-sectional view of the semiconductor structure after additional processing operations according to one or more embodiments of the invention.
Figure 5:
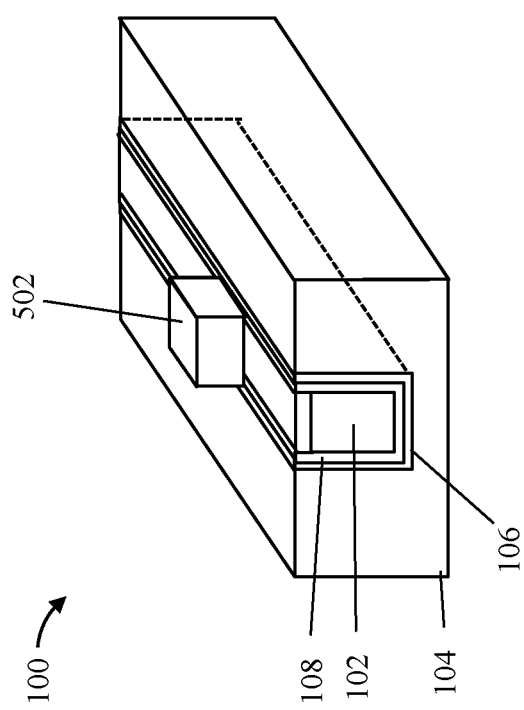
FIG. 5 depicts a cross-sectional view of the semiconductor structure after additional processing operations according to one or more embodiments of the invention.

FIG. 3 depicts a cross-sectional view of the interconnect structure 100 after a processing operation according to one or more embodiments of the invention. In some embodiments of the invention, a top via layer 302 is deposited or formed on the recessed surface of the conductive line 102. In some embodiments of the invention, the top via layer 302 is bulk deposited over the dielectric layer 104. The top via layer 302 can be formed or deposited using, for example, CVD, PECVD, PVD, sputtering, plating, chemical solution deposition, and electroless plating. The top via layer 302 can be deposited to any suitable thickness. In some embodiments of the invention, the top via layer 302 is deposited to a thickness of about 50 nm above a surface of the dielectric layer 104, although other thicknesses are within the contemplated scope of the invention. As shown in FIG. 5, the thickness of the top via layer 302 defines the height of the top via 502.

In some embodiments of the invention, the top via layer 302 can be formed from materials that include a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the top via layer 302 is formed from a same material as the liner 108. For example, the liner 108 and the top via layer 302 can be cobalt or ruthenium layers. In this manner, the liner 108 and the top via layer 302 together define a continuous encapsulation region that completely surrounds the conductive line 102.

Figure 4:
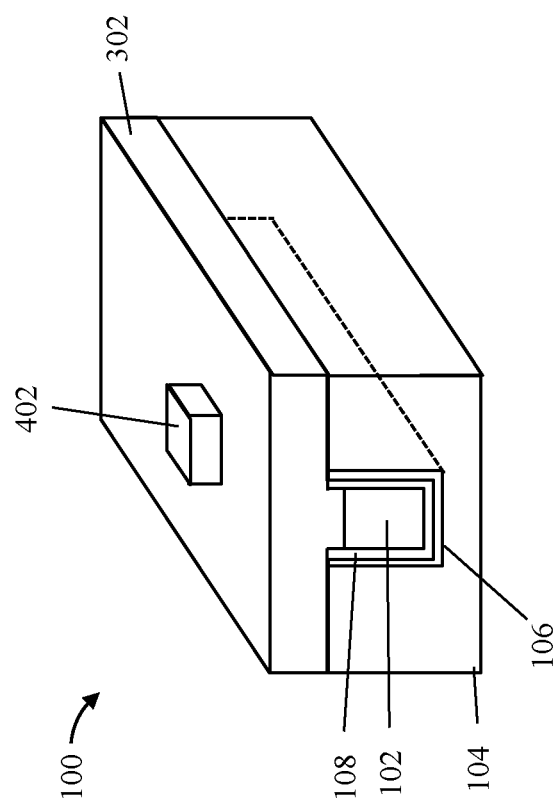
FIG. 4 depicts a cross-sectional view of the semiconductor structure after additional processing operations according to one or more embodiments of the invention.

FIG. 4 depicts a cross-sectional view of the interconnect structure 100 after a processing operation according to one or more embodiments of the invention. In some embodiments of the invention, a hard mask 402 is deposited or formed on a top surface of the top via layer 302. The hard mask 402 can be formed using any suitable process, such as chemical vapor deposition (CVD), plasma-enhanced CVD (PECVD), ultrahigh vacuum chemical vapor deposition (UHVCVD), rapid thermal chemical vapor deposition (RT-CVD), metalorganic chemical vapor deposition (MOCVD), low-pressure chemical vapor deposition (LPCVD), limited reaction processing CVD (LRPCVD), atomic layer deposition (ALD), flowable CVD, spin-on dielectrics, physical vapor deposition (PVD), molecular beam epitaxy (MBE), chemical solution deposition, spin-on dielectrics, or other like process.

The hard mask 402 can be made of any suitable dielectric material, such as, for example, a low-k dielectric, a nitride, silicon nitride, silicon oxide, SiON, SiC, SiOCN, or SiBCN. In some embodiments of the invention, the hard mask 402 is a silicon nitride or silicon oxide hard mask. In some embodiments of the invention, the hard mask 402 is formed to a thickness of about 10 nm to about 60 nm, for example 30 nm, although other thicknesses are within the contemplated scope of the invention.

In some embodiments of the invention, mask material is conformally deposited over the top via layer 302 and then patterned using, for example, reactive ion etching, to form the hard mask 402. In some embodiments of the invention, portions of the material for the hard mask 402 are removed (patterned) using a wet etch, a dry etch, or a combination of sequential wet and/or dry etches to expose a surface of the top via layer 302.

FIG. 5 depicts a cross-sectional view of the interconnect structure 100 after a processing operation according to one or more embodiments of the invention. In some embodiments of the invention, exposed portions of the top via layer 302 (i.e., those portions not under the hard mask 402) are removed. As shown in FIG. 5, remaining portions of the top via layer 302 define a top via 502 (also referred to as an "up via" or as a "$V_x$ layer").

The exposed portions of the top via layer 302 can be removed using, for example, a dry and anisotropic etch. For example, the exposed portions of the top via layer 302 can be removed using a chlorine-based reactive ion etch. In some embodiments of the invention, the exposed portions of the top via layer 302 are removed selective to the liner 106. In some embodiments of the invention, the exposed portions of the top via layer 302 are removed to expose top surfaces of the liner 106 and/or the dielectric layer 104. Advantageously, the remaining portions of the top via layer 302 and the liner 108 completely encapsulate the conductive line 104, ensuring that the conductive line 104 is not exposed to this etching process. Encapsulation is particularly useful when the conductive line 104 is a copper line, as any exposed copper would be damaged during a chlorine-based RIE.

In some embodiments of the invention, the hard mask 402 is removed after patterning the top via 502. In some embodiments of the invention, the hard mask 402 is removed using a wet etch, a dry etch, or a combination of sequential wet and/or dry etches. In some embodiments of the invention, the hard mask 402 is removed selective to the top via 502.

Figure 6:
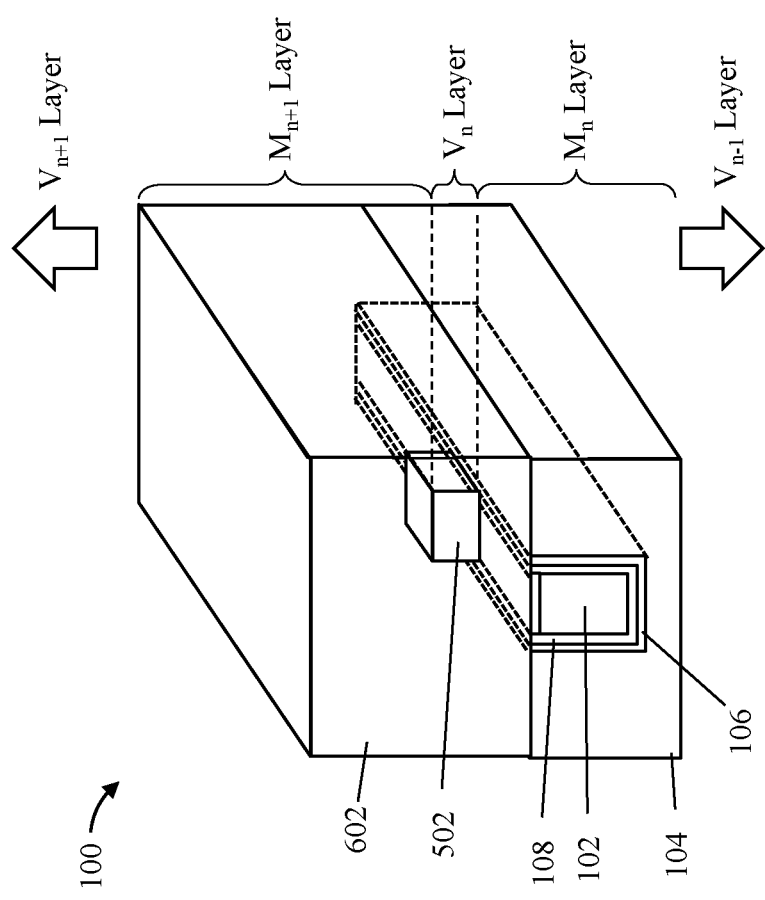
FIG. 6 depicts a cross-sectional view of the semiconductor structure after additional processing operations according to one or more embodiments of the invention.

FIG. 6 depicts a cross-sectional view of the interconnect structure 100 after a processing operation according to one or more embodiments of the invention. In some embodiments of the invention, an interlayer dielectric 602 is formed over the top via 502 and the conductive line 102.

The interlayer dielectric 602 serves as an isolation structure for the lines and vias of the interconnect structure 100. The interlayer dielectric 602 can be made of any suitable dielectric material, such as, for example, low-k dielectrics (materials having a small dielectric constant relative to silicon dioxide, i.e., less than about 3.9), ultra-low-k dielectrics (materials having a dielectric constant less than about 3), porous silicates, carbon doped oxides, silicon dioxides, silicon nitrides, silicon oxynitrides, silicon carbide (SiC), or other dielectric materials. Any known manner of forming the interlayer dielectric 602 can be utilized, such as, for example, CVD, PECVD, ALD, flowable CVD, spin-on dielectrics, or PVD.

After forming the interlayer dielectric 602, the process flow can continue using known BEOL fabrication techniques. For example, the interconnect structure can be planarized to a surface of the top via 502. In some embodiments of the invention, portions of the interlayer dielectric 602 can be removed (not shown) to form a trench exposing a surface of the top via 502. This trench can then be filled with additional conductive material to define conductive lines (e.g., an "$M_{n+1}$ layer") above the top via 502.

While only a single "M" layer (e.g., the conductive line 102) and a single "V" layer (e.g., the top via 502) of the interconnect structure 100 are shown for ease of illustration, it is understood that the interconnect structure 100 can include any number of "M" layers and any number of "V" layers. Each of these "M" layers can be separated from the next "V" layer (the via layer above) by a top via formed in a similar manner as the top via 502.

In other words, after forming the top via 502, one or more additional "M" layers alternating with one or more additional "V" layers can be formed over the interconnect structure 100 using conventional BEOL processes (shown as the "$M_{n+1}$ Layer" and "$V_{n+1}$ Layer" in FIG. 6). For example, if the conductive line 102 defines a first "M" layer (i.e., an M1 layer), a second "M" layer (i.e., an M2 layer) can be formed over the "V1" layer (i.e., the top via 502). Similarly, if the top via 502 defines a first "V" layer (i.e., a V1 layer), a second "V" layer (i.e., a V2 layer) can be formed over the "M2" layer. In this manner, any number of alternating "M" layers and "V" layers can be formed over a substrate. In some embodiments of the invention, each of the "M" layers are electrically coupled to other "M" layers (below or above) through one or more of the "V" layer vias (which can include conventional vias as well as top vias formed according to one or more embodiments of the present invention). For example, one of the conductive lines in the Mn+1 layer can be in electrical contact with the conductive via 802.

Figure 7:
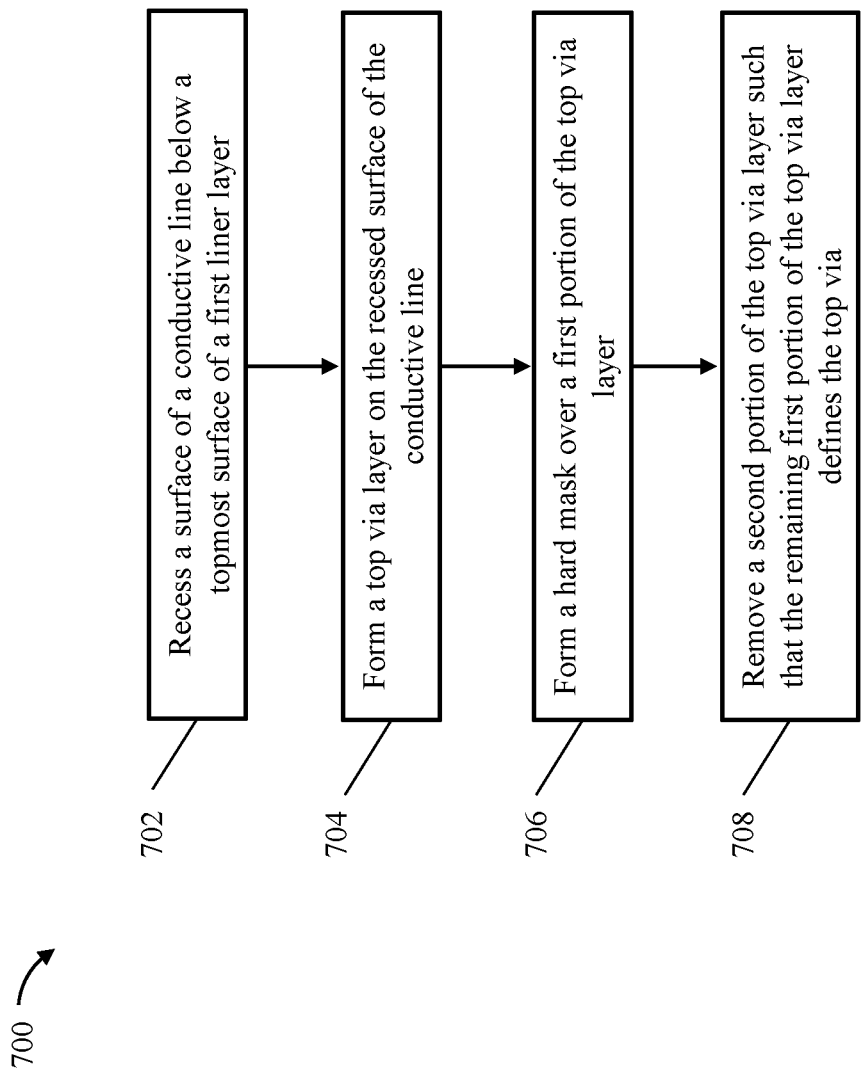
FIG. 7 depicts a flow diagram illustrating a method according to one or more embodiments of the invention.

FIG. 7 depicts a flow diagram 700 illustrating a method for subtractively forming a top via in a metallization region of an integrated circuit according to one or more embodiments of the invention. As shown at block 702, a surface of a conductive line is recessed below a topmost surface of a first liner layer. The first liner layer can be positioned between the conductive line and a dielectric layer. In some embodiments of the invention, the conductive line is positioned in a trench in a metallization layer of an interconnect structure.

At block 704, a top via layer is formed on the recessed surface of the conductive line. In some embodiments of the invention, the conductive line includes copper, while the first liner layer and the top via layer each include ruthenium or cobalt. In some embodiments of the invention, the first liner layer and the top via layer include a same material. In some embodiments of the invention, the first liner layer and the top via layer include different materials.

At block 706, a hard mask is formed over a first portion of the top via layer. At block 708, a second portion of the top via layer is removed. The remaining first portion of the top via layer defines the top via. In some embodiments of the invention, removing the second portion of the top via layer includes a dry anisotropic etch. In some embodiments of the invention, the dry anisotropic etch includes a chlorine-based reactive ion etch.

The method can further include forming a trench in the dielectric layer. In some embodiments of the invention, the first liner layer is conformally deposited in the trench. In some embodiments of the invention, a remaining portion of the trench is filled with the conductive line. In some embodiments of the invention, conductive material is bulk deposited over the trench and planarized to define the conductive line.

In some embodiments of the invention, a barrier liner is conformally deposited between the first liner layer and the dielectric layer. In some embodiments of the invention, the second portion of the top via layer is removed selective to the barrier liner. In some embodiments of the invention, a topmost surface of the top via layer (i.e., the portion of the top via layer that remains in the trench) is coplanar to a topmost surface of the barrier liner.

In some embodiments of the invention, the top via layer comprises the first portion (the portion which ultimately defines the top via), the second portion (the portion that is removed during the etch), and a third portion. In some embodiments of the invention, after removing the second portion of the top via layer, the remaining third portion defines a capping layer over the conductive line.

Figure 8:
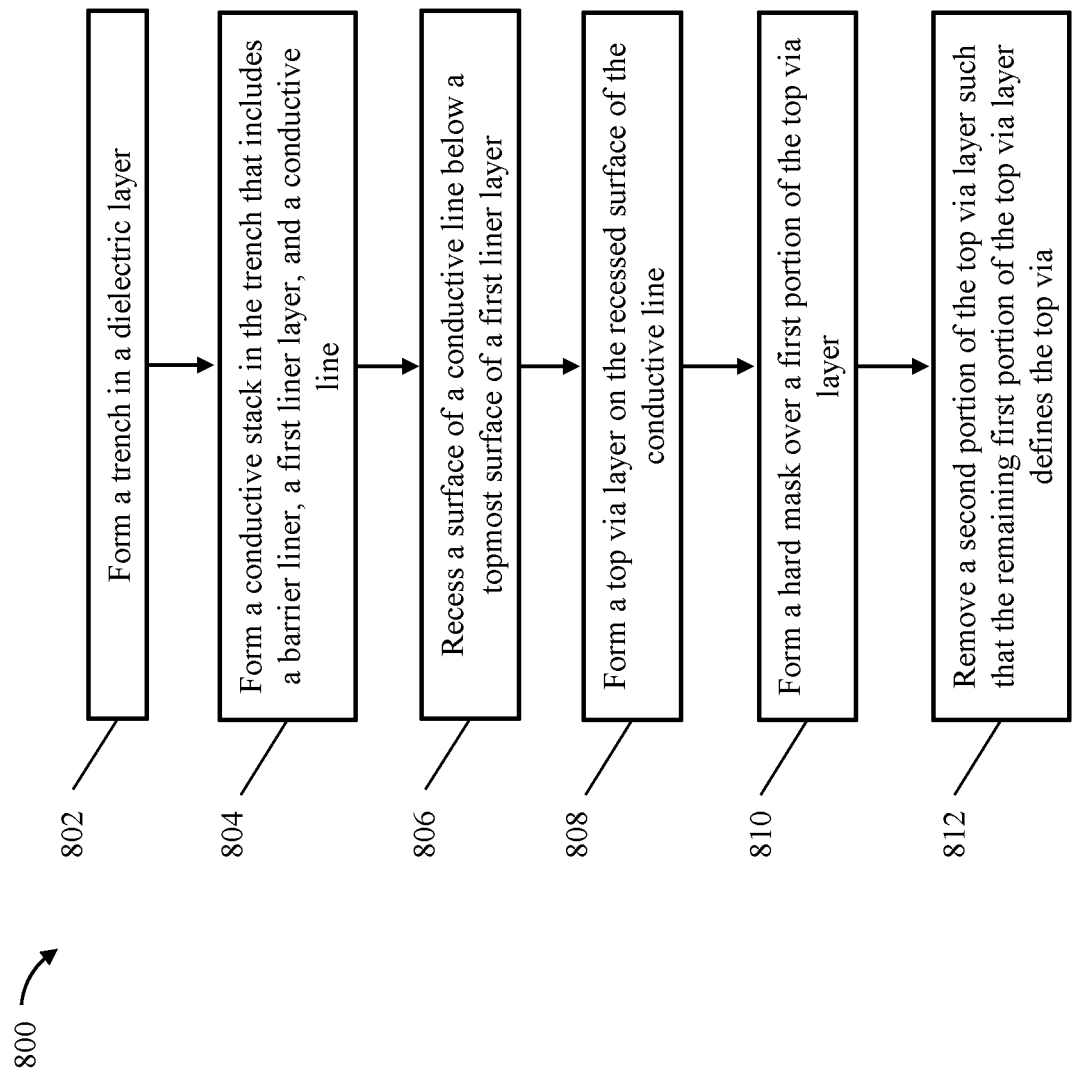
FIG. 8 depicts a flow diagram illustrating a method according to one or more embodiments of the invention.

FIG. 8 depicts a flow diagram 800 illustrating a method for subtractively forming a top via in a metallization region of an integrated circuit according to one or more embodiments of the invention. As shown at block 802, a trench is formed in a dielectric layer.

At block 804, a conductive stack is formed in the trench. In some embodiments of the invention, the conductive stack includes a barrier liner, a first liner layer, and a conductive line. In some embodiments of the invention, the first liner layer is positioned between the barrier liner and the conductive line.

At block 806, a surface of the conductive line is recessed below a topmost surface of the first liner layer. At block 808, a top via layer is formed on the recessed surface of the conductive line and the dielectric layer. In some embodiments of the invention, the conductive line includes copper, while the first liner layer and the top via layer each include ruthenium or cobalt. In some embodiments of the invention, the first liner layer and the top via layer include a same material. In some embodiments of the invention, the first liner layer and the top via layer include different materials.

At block 810, a hard mask is formed over a first portion of the top via layer. The hard mask is patterned to expose a second portion of the top via layer. At block 812, the second portion of the top via layer is removed. The remaining first portion of the top via layer defines a top via. In some embodiments of the invention, removing the second portion of the top via layer includes a dry anisotropic etch. In some embodiments of the invention, the dry anisotropic etch includes a chlorine-based reactive ion etch.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal,"

"top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for subtractively forming a top via in a metallization region of an integrated circuit, the method comprising:
   recessing a surface of a conductive line below a topmost surface of a first liner layer, the first liner layer positioned between the conductive line and a dielectric layer;
   forming a top via layer directly on the recessed surface of the conductive line, the top via layer comprising a conductive material;
   forming a hard mask over a first portion of the top via layer; and
   removing a second portion of the top via layer, wherein the remaining first portion of the top via layer defines the top via, the top via having a topmost surface above the topmost surface of the first liner layer.

2. The method of claim 1, wherein the conductive line comprises copper, the first liner layer comprises ruthenium or cobalt, and the top via layer comprises ruthenium or cobalt.

3. The method of claim 2, wherein the first liner layer and the top via layer comprise a same material.

4. The method of claim 2, wherein the first liner layer and the top via layer comprise different materials.

5. The method of claim 1 further comprising forming a trench in the dielectric layer.

6. The method of claim 5 further comprising conformally depositing the first liner layer in the trench.

7. The method of claim 6 further comprising filling a remaining portion of the trench with the conductive line.

8. The method of claim 7 further comprising conformally depositing a barrier liner between the first liner layer and the dielectric layer.

9. The method of claim 1, wherein removing the second portion of the top via layer comprises a chlorine-based reactive ion etch.

10. The method of claim 1, wherein the top via layer comprises the first portion, the second portion, and a third portion; and wherein after removing the second portion of the top via layer, the remaining third portion defines a capping layer over the conductive line.

11. A method for forming a metallization region of an integrated circuit, the method comprising:
    forming a trench in a dielectric layer;
    forming a conductive stack in the trench, the conductive stack comprising a barrier liner, a first liner layer, and a conductive line, wherein the first liner layer is positioned between the barrier liner and the conductive line;
    recessing a surface of the conductive line below a topmost surface of the first liner layer;
    forming a top via layer directly on the recessed surface of the conductive line and the dielectric layer;
    forming a hard mask over a first portion of the top via layer, the hard mask patterned to expose a second portion of the top via layer; and
    removing the second portion of the top via layer, wherein the remaining first portion of the top via layer defines a top via, the top via having a topmost surface above the topmost surface of the first liner layer.

12. The method of claim 11, wherein the conductive line comprises copper, the first liner layer comprises ruthenium or cobalt, and the top via layer comprises ruthenium or cobalt.

13. The method of claim 12, wherein the first liner layer and the top via layer comprise a same material.

14. The method of claim 12, wherein the first liner layer and the top via layer comprise different materials.

15. The method of claim 11, wherein removing the second portion of the top via layer comprises a dry anisotropic etch.

16. The method of claim 15, wherein the dry anisotropic etch comprises a chlorine-based reactive ion etch.

17. An integrated circuit comprising:
    a conductive stack comprising a barrier liner, a first liner layer, and a conductive line, wherein the first liner layer is positioned between the barrier liner and the conductive line, and wherein a surface of the conductive line is recessed below a topmost surface of the first liner layer;
    a top via layer directly on the recessed surface of the conductive line, wherein a topmost surface of the top via layer is coplanar to a topmost surface of the barrier liner; and
    a top via on a surface of the top via layer, the top via having a topmost surface above the topmost surface of the first liner layer;
    wherein the conductive line comprises copper, the first liner layer comprises ruthenium or cobalt, and the top via layer comprises ruthenium or cobalt.

18. The integrated circuit of claim 17, wherein the conductive stack is positioned in a trench in a metallization layer of an interconnect structure.

19. The integrated circuit of claim 17, wherein the first liner layer, the top via layer, and the top via comprise a same material.

* * * * *